United States Patent
Bando

(10) Patent No.: US 10,516,124 B2
(45) Date of Patent: Dec. 24, 2019

(54) PHOTOELECTRIC CONVERSION ELEMENTS, METHOD OF MANUFACTURING PHOTOELECTRIC CONVERSION ELEMENT, AND SOLID-STATE IMAGING DEVICE

(71) Applicant: SONY CORPORATION, Tokyo (JP)

(72) Inventor: Masashi Bando, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 31 days.

(21) Appl. No.: 15/578,542

(22) PCT Filed: Jun. 1, 2016

(86) PCT No.: PCT/JP2016/066147
§ 371 (c)(1),
(2) Date: Nov. 30, 2017

(87) PCT Pub. No.: WO2016/199632
PCT Pub. Date: Dec. 15, 2016

(65) Prior Publication Data
US 2018/0269414 A1    Sep. 20, 2018

(30) Foreign Application Priority Data

Jun. 11, 2015 (JP) ................. 2015-118105

(51) Int. Cl.
*H01L 51/42* (2006.01)
*H01L 27/30* (2006.01)
(Continued)

(52) U.S. Cl.
CPC ........ *H01L 51/4253* (2013.01); *H01L 27/307* (2013.01); *H01L 51/008* (2013.01);
(Continued)

(58) Field of Classification Search
None
See application file for complete search history.

(56) References Cited

U.S. PATENT DOCUMENTS

2007/0272918 A1    11/2007  Rand et al.
2011/0056562 A1*   3/2011   Hamano ............... C07C 223/06
                                                         136/263
(Continued)

FOREIGN PATENT DOCUMENTS

AR          061130 A1    8/2008
AU    2007268149 A1    12/2007
(Continued)

OTHER PUBLICATIONS

Gommans, et al., "Perfluorinated Subphthalocyanine As a New Acceptor Material in a Small Molecule Bilayer Organic Solar Cell", Advanced Functional Materials 2009, pp. 3435-3439.
(Continued)

*Primary Examiner* — Thien F Tran
(74) *Attorney, Agent, or Firm* — Chip Law Group

(57) ABSTRACT

A photoelectric conversion element includes: a first electrode; a photoelectric conversion layer provided on the first electrode, and including an organic semiconductor with quantum efficiency of 1% or less; and a second electrode provided on the photoelectric conversion layer.

9 Claims, 4 Drawing Sheets

(51) Int. Cl.
*H01L 51/00* (2006.01)
*H01L 51/44* (2006.01)
*H01L 27/146* (2006.01)

(52) U.S. Cl.
CPC ...... *H01L 51/442* (2013.01); *H01L 27/14665* (2013.01); *Y02E 10/549* (2013.01); *Y02P 70/521* (2015.11)

(56) References Cited

U.S. PATENT DOCUMENTS

| | | | | |
|---|---|---|---|---|
| 2013/0181202 | A1* | 7/2013 | Yofu | C07D 219/02 257/40 |
| 2017/0062746 | A1* | 3/2017 | Sawaki | H01L 31/10 |

FOREIGN PATENT DOCUMENTS

| | | |
|---|---|---|
| CA | 2653064 A1 | 12/2007 |
| CN | 101548404 A | 9/2009 |
| EP | 2020047 A2 | 2/2009 |
| HK | 1134859 A1 | 12/2012 |
| JP | 2009-212468 A | 9/2009 |
| JP | 2009-538529 A | 11/2009 |
| JP | 2009-538529 T | 11/2009 |
| JP | 2010-212455 A | 9/2010 |
| JP | 2012-138582 A | 7/2012 |
| JP | 2013-219190 A | 10/2013 |
| JP | 2014-063999 A | 4/2014 |
| JP | 2014-072328 A | 4/2014 |
| KR | 10-2009-0042881 A | 5/2009 |
| TW | 200810168 A | 2/2008 |
| WO | 2007/139704 A2 | 12/2007 |

OTHER PUBLICATIONS

Lee, et al., "Green-Sensitive Organic Photodetectors With High Sensitivity and Spectral Selectivity Using Subphthalocyanine Derivatives", 2013 American Chemical Society, ACS Applied Materials & Interfaces 2013, pp. 13089-13095.

Sullivan, et al., "Halogenated Boron Subphthalocyanines As Light Harvesting Electron Acceptors in Organic Photovoltaics", Advanced Energy Materials 2011, pp. 352-355.

International Search Report and Written Opinion of PCT Application No. PCT/JP2016/066147, dated Aug. 23, 2016, 09 pages of ISRWO.

Sullivan, et al., "Halogenated Boron Subphthalocyanines as Light Harvesting Electron Acceptors in Organic Photovoltaics", Advanced Energy Materials, vol. 1, No. 3, May 2011, pp. 352-355.

Lee, et al., "Green-Sensitive Organic Photodetectors with High Sensitivity and Spectral Selectivity Using Subphthalocyanine Derivatives", ACS Applied Materials & Interfaces, vol. 5, No. 24, 2013, pp. 13089-13095.

Gommans, et al., "Perfluorinated Subphthalocyanine as a New Acceptor Material in a Small-Molecule Bilayer Organic Solar Cell", Advanced Functional Materials, vol. 19, No. 21, Nov. 9, 2009, pp. 3435-3439.

Lee, et al., "Green-Sensitive Organic Photodetectors with High Sensitivity and Spectral Selectivity Using Subphthalocyanine Derivatives", American Chemical Society, 2013, pp. 13089-13095.

* cited by examiner

[FIG. 1A]
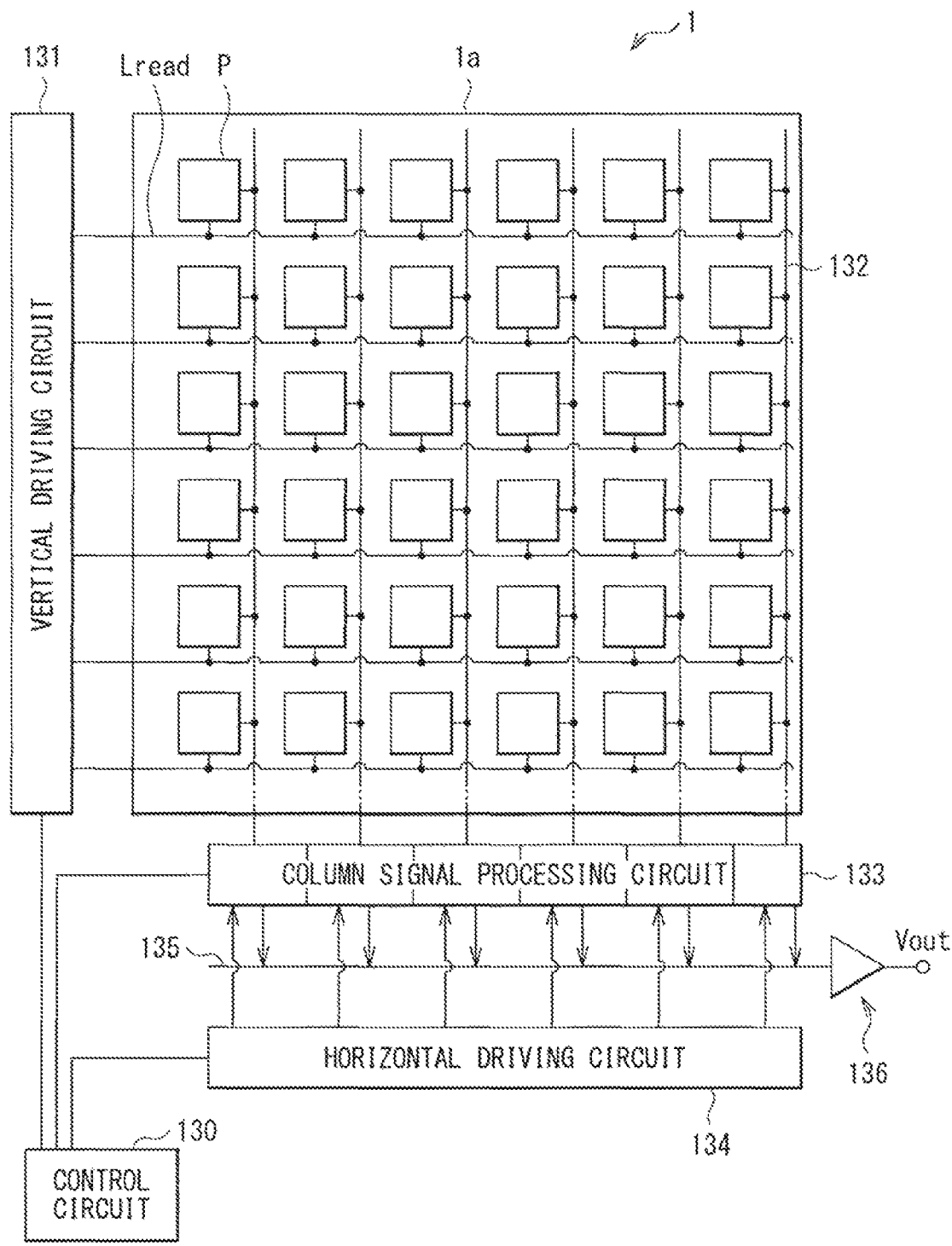

[ FIG. 1B ]
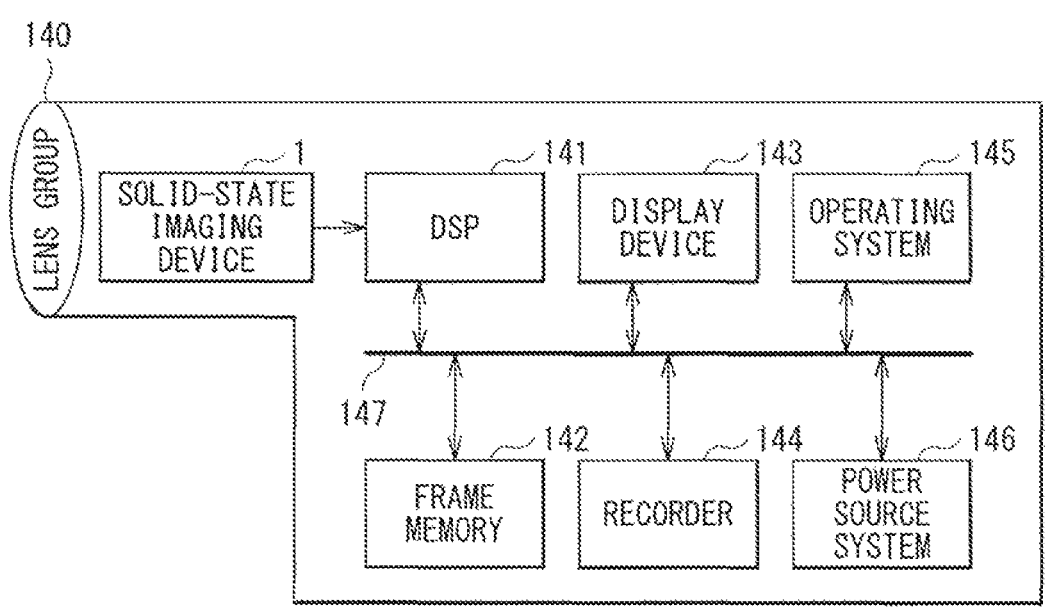

[FIG. 2]
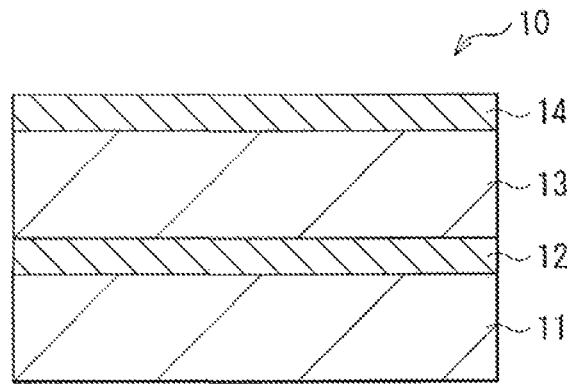
[FIG. 3]
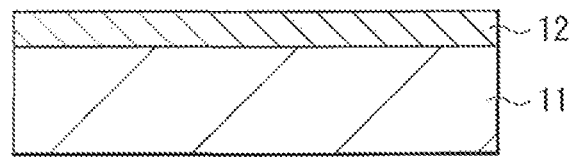
[FIG. 4]
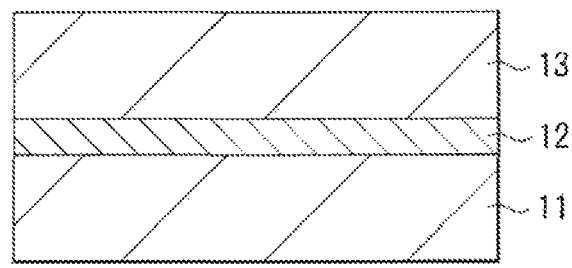
[FIG. 5]
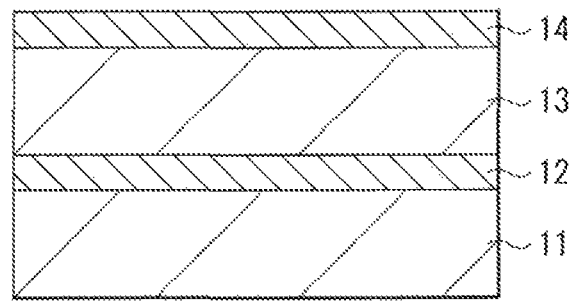

[FIG. 6]
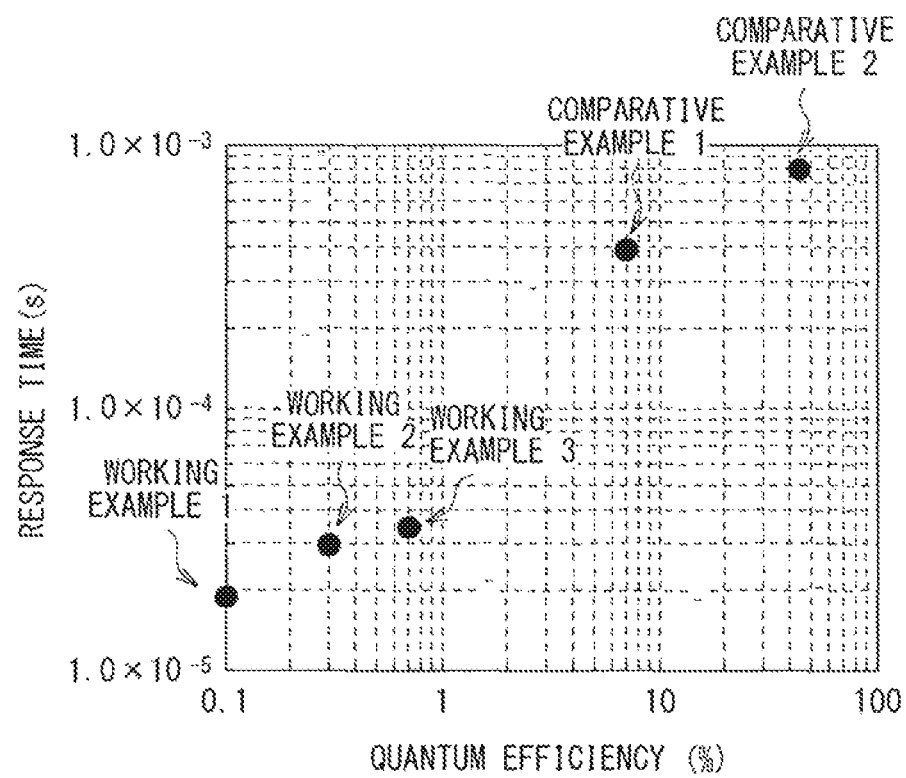
[FIG. 7]
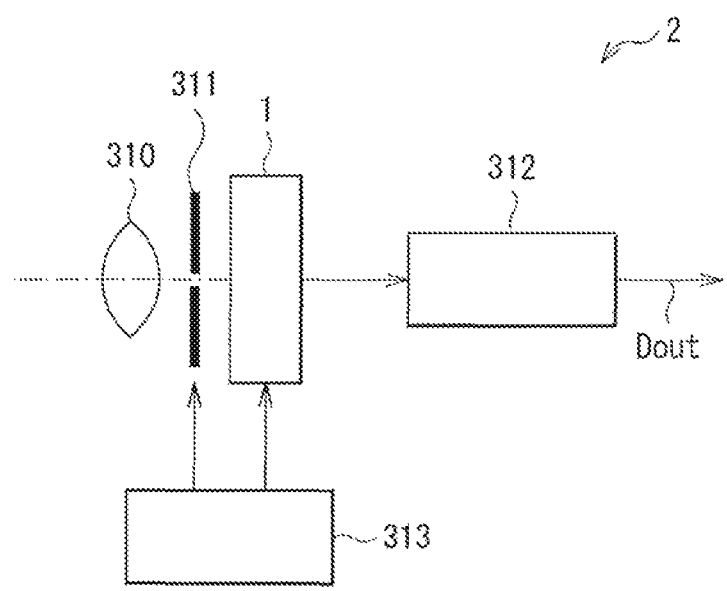

PHOTOELECTRIC CONVERSION ELEMENTS, METHOD OF MANUFACTURING PHOTOELECTRIC CONVERSION ELEMENT, AND SOLID-STATE IMAGING DEVICE

CROSS REFERENCE TO RELATED APPLICATIONS

This application is a U.S. National Phase of International Patent Application No. PCT/JP2016/066147 filed on Jun. 1, 2016, which claims priority benefit of Japanese Patent Application No. JP 2015-118105 filed in the Japan Patent Office on Jun. 11, 2015. Each of the above-referenced applications is hereby incorporated herein by reference in its entirety.

TECHNICAL FIELD

The present disclosure relates to a photoelectric conversion element to be used in, for example, a CCD (Charge-Coupled Device), a CMOS (Complementary Metal-Oxide Semiconductor) image sensor, or any other equivalent device, a method of manufacturing such a photoelectric conversion element, and a solid-state imaging device.

BACKGROUND ART

In recent years, in a solid-state imaging device such as a CCD or a CMOS image sensor, a device type has been proposed that uses a photoelectric conversion element that has a photoelectric conversion layer including an organic semiconductor (for example, see PTLs 1 to 5). Such a photoelectric conversion element with use of the organic semiconductor eliminates the necessity for a color filter, allowing a structure and a manufacturing process to be more simplified in comparison with a photoelectric conversion element with use of an inorganic semiconductor.

In the photoelectric conversion element described in each of PTLs 1 to 3, a lower electrode, a photoelectric conversion layer including the organic semiconductor, and an upper electrode are stacked in this order on a substrate. It is to be noted that, in some cases, a variety of intermediate layers such as an electron blocking layer, a buffer layer, and an active layer may be also provided between the photoelectric conversion layer and each of the electrodes.

CITATION LIST

Patent Literature

[PTL 1] Japanese Unexamined Patent Application Publication No. 2013-219190
[PTL 2] Japanese Unexamined Patent Application Publication No. 2014-063999
[PTL 3] Japanese Unexamined Patent Application Publication No. 2014-072328
[PTL 4] Japanese Unexamined Patent Application Publication No. 2009-212468
[PTL 5] Japanese Unexamined Patent Application Publication No. 2012-138582

SUMMARY OF THE INVENTION

In the above-described photoelectric conversion element with use of the organic semiconductor, optical responsivity in the photoelectric conversion layer is important. In a solid-state imaging element to be used for a digital camera or any other equivalent electronic apparatus, low optical responsivity causes a residual image to be generated at the time of imaging of a moving object, or at the time of photographing of moving images. Therefore, improvement of the optical responsivity is desired.

PTLs 4 and 5 each propose a specific method of improving the responsivity in the solid-state imaging element using the organic semiconductor for the photoelectric conversion layer. For example, PTL 4 proposes an element structure in which the photoelectric conversion layer includes one or more organic compound semiconductors, and a relationship of $0.1 < h1/e1 < 10$ is satisfied, where hole mobility and electron mobility of the photoelectric conversion layer are h1 and e1, respectively. Further, PTL 5 proposes a method in which the photoelectric conversion layer includes one or more organic compound semiconductors; a relationship of $0.1 < h1/e1 < 10$ is satisfied, where the hole mobility and the electron mobility of the photoelectric conversion layer are respectively h1 and e1; and a control is made to ensure that the hole mobility h1 is at least $8.5E-6 \text{ cm}^2/\text{Vs}$ but no more than $3.8E-5 \text{ cm}^2/\text{Vs}$, while the electron mobility e1 is at least $9.3E-7 \text{ cm}^2/\text{Vs}$ but no more than $7.6E-5 \text{ cm}^2/\text{Vs}$. It is desired to achieve a more simplified method that is different from these methods.

It is therefore desirable to provide a photoelectric conversion element that allows for improvement of optical responsivity, a method of manufacturing such a photoelectric conversion element, and a solid-state imaging device.

A photoelectric conversion element according to an embodiment of the present disclosure includes: a first electrode; a photoelectric conversion layer provided on the first electrode, and including an organic semiconductor with quantum efficiency of 1% or less; and a second electrode provided on the photoelectric conversion layer.

A method of manufacturing a photoelectric conversion element according to an embodiment of the present disclosure includes: forming, on a first electrode, a photoelectric conversion layer that includes an organic semiconductor with quantum efficiency of 1% or less; and forming a second electrode on the photoelectric conversion layer.

A solid-state imaging device according to an embodiment of the present disclosure has the photoelectric conversion element according to the above-described embodiment of the present disclosure.

In the photoelectric conversion element, the method of manufacturing the photoelectric conversion element, and the solid-state imaging device according to the respective embodiments of the present disclosure, the quantum efficiency of the organic semiconductor included in the photoelectric conversion layer is 1% or less. Here, if the quantum efficiency of a single-layer film including a single organic semiconductor (the quantum efficiency of the independent organic semiconductor) is high, an energy level is more likely to spread on the pertinent single-layer film. In other words, a HOMO (Highest Occupied Molecular Orbital) level or a LUMO (Lowest Unoccupied Molecular Orbital) level is distributed irregularly, causing exciton dissociation to be promoted more easily due to light absorption. Meanwhile, in conduction of free carriers after the exciton dissociation, in a case where the energy level is distributed irregularly, activation energy of the carrier conduction becomes large, resulting in the free carriers being less likely to be conducted. In other words, irregularity in the energy level of the organic semiconductor included in the photoelectric conversion layer has an influence on the quantum efficiency, causing the free carriers to be conducted more easily in the organic semiconductor with low quantum efficiency (quantum efficiency of 1% or less).

According to the photoelectric conversion element, the method of manufacturing the photoelectric conversion element, and the solid-state imaging device of the respective embodiments of the present disclosure, the photoelectric conversion layer includes the organic semiconductor with quantum efficiency of 1% or less, which makes it possible to suppress spreading of the energy level and facilitate conduction of the free carriers in the organic semiconductor. This makes it possible to improve optical responsivity.

It is to be noted that the above-described contents are merely examples of the present disclosure. The effects of the present disclosure are not necessarily limited to the above-described effects, and may be effects other than those described herein, or may further include other effects.

BRIEF DESCRIPTION OF THE DRAWINGS

FIG. 1A is a functional block diagram of a solid-state imaging device according to an embodiment of the present disclosure.

FIG. 1B is a functional block diagram illustrating a configuration of an electronic apparatus on which the solid-state imaging device illustrated in FIG. 1A is mounted.

FIG. 2 is a cross-sectional diagram illustrating a major part configuration of a photoelectric conversion element in each of pixels illustrated in FIG. 1A.

FIG. 3 is a cross-sectional diagram for explaining a method of manufacturing the photoelectric conversion element illustrated in FIG. 2.

FIG. 4 is a cross-sectional diagram for explaining a process subsequent to the process illustrated in FIG. 3.

FIG. 5 is a cross-sectional diagram for explaining a process subsequent to the process illustrated in FIG. 4.

FIG. 6 is a characteristic diagram illustrating a relationship between quantum efficiency and response time in Working Examples 1 to 3.

FIG. 7 is a functional block diagram illustrating an example of an application example (camera).

MODES FOR CARRYING OUT THE INVENTION

Hereinafter, some embodiments of the present disclosure are described in detail with reference to the drawings. It is to be noted that the description is given in the following order.
1. Embodiment (an example of a photoelectric conversion element having a photoelectric conversion layer that includes an organic semiconductor with quantum efficiency of 1% or less, and a solid-state imaging device)
2. Working Examples (working examples in which a subphthalocyanine derivative is used for a photoelectric conversion layer)
3. Application Example (an example of a camera)

EMBODIMENT

[Configuration]

FIG. 1A illustrates a functional configuration of a solid-state imaging device (a solid-state imaging device 1) according to an embodiment of the present disclosure. FIG. 1B illustrates a configuration of an electronic apparatus on which the solid-state imaging device 1 is mounted. The solid-state imaging device 1 is, for example, a CCD or a CMOS image sensor. The electronic apparatus illustrated in FIG. 1B includes, for example, a lens group 140, the solid-state imaging device 1, a digital signal processor (DSP) 141, a frame memory 142, a display device 143, a recorder 144, an operating system 145, and a power source system 146. Among these components, the DSP 141, the frame memory 142, the display device 143, the recorder 144, the operating system 145, and the power source system 146 are electrically coupled to one another through a bus line 147.

The solid-state imaging device 1 has, for example, an imaging region 1a, a vertical driving circuit 131, a column signal processing circuit 133, a horizontal driving circuit 134, an output circuit 136, and a control circuit 130 on a semiconductor substrate (for example, a silicon semiconductor substrate). At the imaging region 1a, a plurality of pixels P each of which includes a photoelectric conversion element 10 to be described later are disposed in a two-dimensional array pattern. It is to be noted that the circuits such as the vertical driving circuit 131, the column signal processing circuit 133, the horizontal driving circuit 134, the output circuit 136, and the control circuit 130 are configurable with use of a variety of circuits to be used in the solid-state imaging device. It is to be noted that the solid-state imaging device 1 may be of a front side illumination type or a so-called backside illumination type. In addition, a shutter that serves to control entry of light into the pixel P may be disposed as appropriate.

The vertical driving circuit 131 includes, for example, a shift register, and sequentially selects and scans the pixels P in the imaging region 1a in a vertical direction on a row basis. A pixel signal (a signal based on a current generated depending on the amount of light received) to be outputted from each of the pixels P of a pixel row that are selected and scanned by the vertical driving circuit 131 is sent to the column signal processing circuit 133 through a vertical signal line 132.

The column signal processing circuit 133 is disposed, for example, for each of pixel columns, and performs signal processes such as noise rejection and signal amplification, for example, on signals to be outputted from the pixels P in one row using a signal from a black reference pixel (that is formed in a peripheral region of the imaging region 1a, for example) for each of the pixels P. A horizontal selection switch is provided at an output stage of the column signal processing circuit 133, and the column signal processing circuit 133 and a horizontal signal line 135 are coupled to each other through the horizontal selection switch.

The horizontal driving circuit 134 includes, for example, a shift register, and sequentially selects the column signal processing circuits 133 by sequentially outputting horizontal scanning pulses to output a signal from each of the column signal processing circuits 133 to the horizontal signal line 135.

The output circuit 136 performs a signal process on signals to be supplied sequentially from the horizontal signal line 135 to provide a resultant output (generate an output signal Vout).

The control circuit 130 generates a clock signal and a control signal that act as references for operation of the vertical driving circuit 131, the column signal processing circuit 133, and the horizontal driving circuit 134 on the basis of, for example, a vertical synchronization signal, a horizontal synchronization signal, and a master clock. The generated clock signal and control signal are inputted to the vertical driving circuit 131, the column signal processing circuit 133, and the horizontal driving circuit 134.

The imaging region 1a has the plurality of pixels P that are two-dimensionally disposed in a matrix pattern, for example. In these pixels P, for example, a pixel drive line Lread (specifically, a row selection line and a reset control line) is disposed for each of pixel rows, and the vertical signal line 132 is disposed for each of pixel columns. The pixel drive line Lread serves to provide a drive signal for signal readout from the pixel. One end of the pixel drive line Lread is coupled to an output end corresponding to each row of the vertical driving circuit 131. Detailed configuration of the imaging region 1a is described later.

As will hereinafter be described in detail, a photoelectric conversion element with use of an organic semiconductor is formed in each of the pixels P. An on-chip lens, a protective film, etc. may be provided on light incident side of the imaging region 1a. Further, in the photoelectric conversion element with use of the organic semiconductor, a color filter may be provided, or may not be provided on an as-needed basis. For example, selection of a photoelectric conversion material allows a photoelectric conversion layer itself to also function as the color filter. In such a case, color separation is achievable even if no color filter is disposed. Alternatively, in a case where the color filter is disposed on light incident side of the pixel P, it is possible to use a well-known color filter that transmits one or a plurality of wavelengths of, for example, red, green, blue, cyan, magenta, yellow, and any other color.

FIG. 2 schematically illustrates a major part configuration of a photoelectric conversion element (a photoelectric conversion element 10) that is formed in each of the pixels in the imaging region 1a. The photoelectric conversion element 10 includes a first electrode (a pixel electrode) 12, a photoelectric conversion layer 13, and a second electrode 14 in this order on a support substrate 11. It is to be noted that, the photoelectric conversion element 10 is so configured as to allow light to enter the photoelectric conversion layer 13 from both a side on which the first electrode 12 is located of and a side on which the second electrode 14 is located (i.e., from both upper and lower sides). However, a light incident direction is not specifically limitative, and the light may enter only from the side on which the first electrode 12 is located, or the light may enter only from the side on which the second electrode 14 is located.

The support substrate 11 includes any of materials such as glass, plastic, and silicon. A substrate material is not specifically limitative; however, in a case where the light enters from the side on which the first electrode 12 is located, a material having transparency in a visible light region is selected. In a case where the light does not enter from the side on which the first electrode 12 is located, it is also possible to adopt a structure to be achieved in such a manner that the support substrate 11 is configured with use of a silicon semiconductor substrate; the above-described driving circuits and any other associated circuits are provided on the silicon semiconductor substrate; and the photoelectric conversion element 10 is stacked on the silicon semiconductor substrate.

The first electrode 12 includes any of materials having electrical conductivity such as a transparent electrically-conductive film and a metallic material. In a case where the light enters from the side on which the first electrode 12 is located, as a constituent material of the first electrode 12, the transparent electrically-conductive film having transparency in a visible light region is selected. An example of the transparent electrically-conductive film is a transparent electrically-conductive film contains one or more of indium tin oxide (ITO), indium gallium zinc oxide (IGZO), zinc oxide (ZnO), indium zinc oxide (IZO), iridium oxide ($IrO_2$), titanium oxide ($TiO_2$), and tin oxide ($SnO_2$). An example of the metallic material is aluminum (Al).

The photoelectric conversion layer 13 includes one or more kinds of organic semiconductors. Desirably, the photoelectric conversion layer 13 includes heterogeneous materials, specifically a hole-transport material (a donor material) and an electron-transport material (an acceptor material). This is because a bulk heterojunction (a bulk heterostructure) is formed by mixture of the hole-transport material and the electron-transport material, which allows photoelectric conversion efficiency to be improved. The hole-transport material and the electron-transport material are formed, for example, by lamination or mixture in the photoelectric conversion layer 13. As the organic semiconductor, various organic pigments are usable, and examples of the organic pigments include a subphthalocyanine derivative, a quinacridone derivative, a phthalocyanine derivative, an oxadiazole derivative, a stilbene derivative, a perylene derivative, a tetracyanoquinodimethane derivative, a phenanthroline derivative, a naphthalene derivative, a pyrene derivative, and a fluoranthene derivative. Alternatively, a material such as a metal complex pigment may be used. Further, any organic materials other than the pigments, such as fullerene (C60) and BCP (Bathocuproine) may be laminated on the photoelectric conversion layer 13. A film thickness of the photoelectric conversion layer 13 is not limitative, and is at least 50 nm but no more than 1 μm.

Desirably, the electron-transport material contains the subphthalocyanine derivative among the above-described materials. At this time, the hole-transport material contains, for example, the quinacridone derivative such as 2,9-di-tert-butylquinacridone or N-methylquinacridone.

In the photoelectric conversion layer 13, quantum efficiency of one or more kinds of the organic semiconductors, for example, the electron-transport material is 1% or less. More desirably, the quantum efficiency is at least 0.1% but no more than 0.7%. The quantum efficiency defined here is quantum efficiency that the organic semiconductor itself has (the quantum efficiency of the single organic semiconductor), and the quantum efficiency obtained in a single-layer film of the pertinent organic semiconductor. It is to be noted that quantum efficiency n is a ratio of the number of carriers generated to the number of incoming photons, and it is possible to represent the quantum efficiency n using the following Expression (A), where h is a Planck's constant, c is a light velocity in vacuum, q is an electron charge, λ is a wavelength, I is an electric current, and P is a light output.

$$n=\{(hc)/(q\lambda)\}\cdot(I/P) \qquad (A)$$

As the electron-transport material, it is preferable to use, for example, the subphthalocyanine derivative represented by the following general formula of Chemical Formula 1, where each of R1 to R12 contains, for example, one selected from a group including a hydrogen atom (H), a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the above-described R1 to R12, and Z is nitrogen, CH, or CH of which H is substituted by one selected from a group including substituent groups similar to those of the above-described R1 to R12.

[Chemical Formula 1]

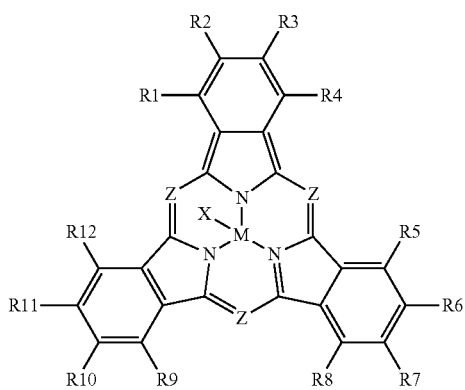

Further, more desirably, as the electron-transport material, subphthalocyanine derivatives represented by the following general formulas of Chemical Formula 2, Chemical Formula 3, and Chemical Formula 4 are used. In other words, in the above-described general formula of Chemical Formula 1, each of R1, R4, R5, R8, R9, and R12 is a hydrogen atom, and each of R2, R3, R6, R7, R10, and R11 is a fluorine atom. In addition, in Chemical Formula 2, M is boron; X is fluorine; and Z is nitrogen. In Chemical Formula 3, M is boron; X is a phenol substituted by fluorine; and Z is nitrogen. In Chemical Formula 4, M is boron; X is chlorine; and Z is nitrogen.

[Chemical Formula 2]

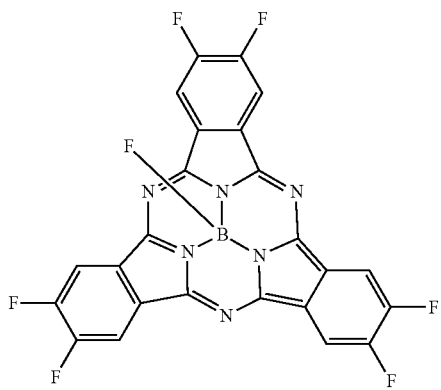

[Chemical Formula 3]

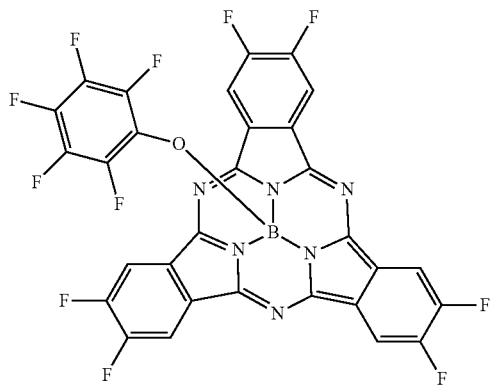

[Chemical Formula 4]

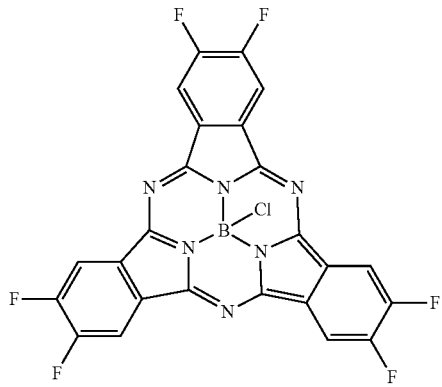

Independent quantum efficiency of each of the subphthalocyanine derivatives represented by Chemical Formula 1 to Chemical Formula 4 as described above is low (1% or less). As will hereinafter be described in detail, this facilitates conduction of free carriers after exciton dissociation, which consequently allows optical responsivity to be improved. A presumable reason for this is that use of the fluorine atoms for R2, R3, R6, R7, R10, and R11 in Chemical Formula 1 weakens intermolecular interaction, leading to enhancement of an amorphous property. In an organic semiconductor having the amorphous property, it is less likely that an energy level becomes irregular in comparison with a material containing many grain boundaries, such as polycrystal or microcrystal.

Further, each of R1 to R12 in Chemical Formula 1 as noted above may be a portion of a condensed aliphatic ring or a condensed aromatic ring, or these rings may contain one or more atoms other than carbon. In addition, as represented by the following general formula of Chemical Formula 5, two or more subphthalocyanine derivatives may be contained, or a structure that binds one subphthalocyanine derivative and a subporphyrin ring may be adopted. It is to be noted that R13 is a substituent group that is bindable to one or more subphthalocyanine derivatives or a subporphyrin ring through M or any location of R1 to R12 (any of the group including substituent groups similar to those of the above-described R1 to R12).

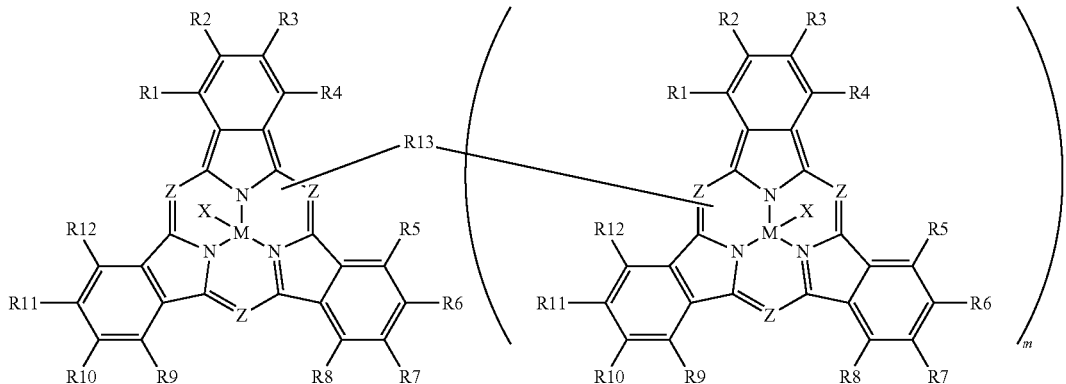

[Chemical Formula 5]

The second electrode 14 includes a material having electrical conductivity such as a transparent electrically-conductive film and a metallic material. In a case where the light enters from the side on which the second electrode 14 is located, as a constituent material of the second electrode 14, a transparent electrically-conductive film having transparency in a visible light region is selected. An example of the transparent electrically-conductive film is a transparent electrically-conductive film that contains one or more of indium tin oxide (ITO), indium gallium zinc oxide (IGZO), zinc oxide (ZnO), indium zinc oxide (IZO), iridium oxide ($IrO_2$), titanium oxide ($TiO_2$), and tin oxide ($SnO_2$). An example of the metallic material is aluminum (Al). It is to be noted that, in a case where the light enters only from the side on which the second electrode 14 is located, materials of the support substrate 11 and the first electrode 12 are not specifically limitative.

[Manufacturing Method]

FIGS. 3 to 5 are schematic diagrams for explaining a method of manufacturing the photoelectric conversion element 10 illustrated in FIG. 2. It is possible to manufacture the photoelectric conversion element 10 in the following manner, for example. In other words, first, the first electrode 12 including the above-described material (for example, ITO) is formed with a film thickness of about 100 nm on the support substrate 11 including the above-described material by, for example a sputtering method, as illustrated in FIG. 3. Thereafter, the first electrode 12 is patterned through etching with use of, for example, a photolithographic method.

Next, the photoelectric conversion layer 13 is formed on the first electrode 12, as illustrated in FIG. 4. Specifically, a film including, for example, mixture of the hole-transport material and the electron-transport material as described above is formed with a film thickness of, for example, 100 nm on the first electrode 12 through vapor deposition with use of, for example, a resistive-heating vacuum deposition apparatus.

Depending on materials to be used, it is possible to form the photoelectric conversion layer 13 by a variety of methods other than the resistive-heating vacuum deposition method as described above. For example, it is possible to cite a coating method, a physical vapor deposition method (a PVD method), and a variety of chemical vapor deposition methods (CVD methods) including an MOCVD method. Examples of the coating method include a spin coat method, an immersion method, a casting method, a screen printing method, an ink-jet printing method, an offset printing method, a gravure printing method, a stamp method, a spray method, an air doctor coater method, a blade coater method, a rod coater method, a knife coater method, squeeze coater method, a reverse roll coater method, a transfer roll coater method, a gravure coater method, a kiss coater method, a cast coater method, a spray coater method, a slit-orifice coater method, and a calendar coater method. It is to be noted that in the coating method, a non-polar or low-polarity organic solvent such as toluene, chloroform, hexane, and ethanol are applicable as a solvent. Further, examples of the PVD method include a vacuum deposition method (such as an electron-beam heating method, a resistive-heating method, and a flash deposition method), a plasma deposition method, a sputtering method (such as a two-pole sputtering method, a direct-current sputtering method, a direct-current magnetron sputtering method, a high-frequency sputtering method, a magnetron sputtering method, an ion-beam sputtering method, and a bias sputtering method), and an ion plating method (such as a DC (direct current) method, a RF method, a multi-cathode method, an activated reaction method, an electric field deposition method, a high-frequency ion plating method, and a reactive ion plating method).

Thereafter, the second electrode 14 including the above-described material (for example, Al) is formed with a film thickness of 100 nm on the photoelectric conversion layer 13 by, for example, a vacuum deposition method, as illustrated in FIG. 5. This makes it possible to manufacture the photoelectric conversion element 10 having the photoelectric conversion layer 13 with the bulk heterojunction as illustrated in FIG. 2.

[Effects]

In the solid-state imaging device 1 of the present embodiment, light having entered the imaging region 1a is subjected to photoelectric conversion in the photoelectric conversion element 10 of each of the pixels P. Specifically, the light having entered the photoelectric conversion element 10 passes through, for example, the first electrode 12 (or passes through the second electrode 14) to reach the photoelectric conversion layer 13. In the photoelectric conversion layer 13, a pair of an electron and a hole (excitons) are generated, and one of them (for example, the electron) is read out to the vertical signal line 132 as a signal charge. The readout signal is outputted to the outside through the horizontal signal line 135. Alternatively, the readout signal may be inputted to the DSP 141, etc. illustrated in FIG. 1B to be held in the recorder 144. Such a manner makes it possible for the solid-state imaging device 1 to acquire an electrical signal that is generated by the photoelectric conversion.

In the photoelectric conversion layer 13 with use of the organic semiconductor as described above, it is desired to improve optical responsivity thereof. Here, in a thin film of the organic semiconductor, if the quantum efficiency of the independent organic semiconductor is high, the energy level is more likely to spread in the pertinent film. In other words, the HOMO (Highest Occupied Molecular Orbital) level or the LUMO (Lowest Unoccupied Molecular Orbital) level is distributed irregularly, causing exciton dissociation to be promoted more easily due to light absorption.

Meanwhile, in conduction of free carriers after the exciton dissociation, if the energy level is distributed irregularly, activation energy of the carrier conduction becomes large, leading to inhibition of the carrier conduction. Therefore, it is preferable that the quantum efficiency that a material of the organic semiconductor included in the photoelectric conversion layer 13 has by itself be low, specifically 1% or less. As a result, it is presumable that the energy level is less likely to be distributed irregularly. In other words, irregularity in the energy level of the organic semiconductor included in the photoelectric conversion layer has an influence on the quantum efficiency, causing the free carriers to be conducted more easily in the organic semiconductor with low quantum efficiency (quantum efficiency of 1% or less).

Further, the photoelectric conversion layer 13 has the electron-transport material and the hole-transport material, and the quantum efficiency of the electron-transport material of those materials is kept at 1% or less, which allows optical responsivity to be improved effectively. A reason for this is that optical responsivity in a photoelectric conversion element in which holes and electrons are generated in pairs is affected by a carrier type exhibiting slower carrier mobility of the hole and the electron. Therefore, responsivity of the photoelectric conversion element is determined by a carrier type exhibiting lower responsivity, not by a balance between hole mobility and electron mobility. For example, in a case where optical responsivity is more likely to be affected by electron mobility, the quantum efficiency of the electron-transport material is desirably lowered.

Meanwhile, in the photoelectric conversion element 10, in addition to the optical responsivity as described above, the quantum efficiency (hereinafter referred to as sensitivity) of the whole photoelectric conversion layer 13 is also an important factor. As described above, in the conduction of free carriers after the exciton dissociation, if the energy level is distributed irregularly, the activation energy of the carrier conduction becomes large, leading to inhibition of the carrier conduction. That is, the optical responsivity and the sensitivity have a trade-off relationship.

Accordingly, while it is possible to improve the optical responsivity as described above by lowering the quantum efficiency of the organic semiconductor in the photoelectric conversion layer 13 (by keeping the quantum efficiency at 1% or less), the sole use of the organic semiconductor with the low quantum efficiency for the photoelectric conversion layer 13 leads to deterioration in the sensitivity.

In contrast, in the present embodiment, the photoelectric conversion layer 13 has the bulk heterojunction of heterogeneous materials. This makes it possible to enhance the sensitivity of the whole photoelectric conversion layer 13, or to suppress deterioration in the sensitivity. A reason for this is that in general, in the photoelectric conversion layer 13, excitons arising after light absorption are bound strongly, and free carriers are less likely to be generated by energy to the degree of ambient temperature. Therefore, creating junction (bulk heterojunction) of the heterogeneous materials (the hole-transport material and the electron-transport material) that are different in the energy level makes it possible to promote exciton dissociation in a hetero interface. A difference in the energy among molecules configuring the photoelectric conversion layer 13 leads to promotion of generation of the free carriers. Further, the hole after the exciton dissociation conducts the HOMO of a material with a shallow energy level, and the electron conducts the LUMO of a material with a deep energy level. In such a manner, even if the bulk heterojunction of the heterogeneous materials is created, the conduction of the free carriers are less likely to be affected (the responsivity is less likely to be affected).

Consequently, the photoelectric conversion layer 13 includes the bulk heterojunction of the electron-transport material and the hole-transport material, which makes it possible to improve the optical responsivity while enhancing the quantum efficiency (sensitivity) of the whole photoelectric conversion layer 13. This allows for achievement of the improvement in the two characteristics that inherently have a trade-off relationship.

As described thus far, in the present embodiment, the quantum efficiency of the organic semiconductor included in the photoelectric conversion layer 13 is 1% or less, which makes it possible to suppress spreading of the distribution of the energy level, and to facilitate the conduction of the free carriers. This makes it possible to improve optical responsivity.

WORKING EXAMPLES

Working Example 1

In the photoelectric conversion element 10 illustrated in FIG. 2, a measurement was made for the response time in a case where the subphthalocyanine derivative represented in the above-described Chemical Formula 2 was used as the photoelectric conversion layer 13. The photoelectric conversion element 10 used for measurement was a photoelectric conversion element in which the first electrode including ITO, the photoelectric conversion layer 13, and the second electrode 14 including Al were formed in this order on the support substrate 11 including quartz. As the photoelectric conversion layer 13, a film of the subphthalocyanine derivative (Chemical Formula 2) was formed with a thickness of 100 nm. Further, the quantum efficiency (in %) of the subphthalocyanine derivative (Chemical Formula 2) was calculated at an amount of light at the time when the photocurrent density became 1 ($\mu A/cm^2$) with $-5.0\times10^5$ (V/cm) ($-5.0\times E+5$ (V/cm)) applied to the first electrode 12. In addition, for the response time (s), light irradiation was carried out at an exciting wavelength of 530 nm to cause the photocurrent density to became 1 ($\mu A/cm^2$) with $-5.0\times10^5$ (V/cm) applied to the first electrode 12, and a time taken from the end of the light irradiation to attenuation of the photocurrent density down to 0.1 ($\mu A/cm^2$) (that is, a time taken until the photocurrent attenuated down to 10% of a level at the time of the light irradiation) was defined as the response time.

As a result of the above-described measurement, the quantum efficiency of the subphthalocyanine derivative (Chemical Formula 2) was 0.1%, and the response time was $1.9\times10^{-5}$ (s).

Further, as a comparative example (a comparative example 1) relative to the working example 1, an element with use of the subphthalocyanine derivative represented by the following general formula of Chemical Formula 6 was fabricated. Additionally, as a comparative example (a comparative example 2) relative to the working example 1, an element with use of the subphthalocyanine derivative represented by the following general formula of Chemical Formula 7 was fabricated. It is to be noted that, also in the comparative examples 1 and 2, with the exception that the organic semiconductor to be used for the photoelectric conversion layer is different, the elements were fabricated, and the measurement was made for the quantum efficiency and the response time in a manner similar to the above-described working example 1.

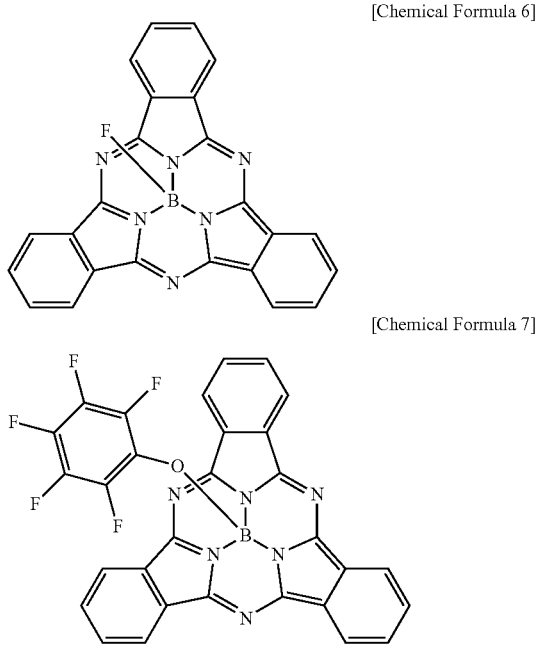

[Chemical Formula 6]

[Chemical Formula 7]

As a result of the measurement, in the comparative example 1, the quantum efficiency of the subphthalocyanine derivative (Chemical Formula 6) was 7%, and the response time was $4.0 \times 10^{-4}$ (s). In the comparative example 2, the quantum efficiency of the subphthalocyanine derivative (Chemical Formula 7) was 44%, and the response time was $8.0 \times 10^{-4}$ (s). As seen from the above, the working example 1 made it possible to shorten the response time as compared with the comparative examples 1 and 2.

Working Example 2

In the photoelectric conversion element 10 illustrated in FIG. 2, the measurement was made for the response time in a case where the subphthalocyanine derivative represented in the above-described Chemical Formula 3 was used as the photoelectric conversion layer 13. With the exception that the organic semiconductor used for the photoelectric conversion layer 13 was different, the element was fabricated, and the measurement was made for the quantum efficiency and the response time in a manner similar to the above-described working example 1.

As a result of the above-described measurement, the quantum efficiency of the subphthalocyanine derivative (Chemical Formula 3) was 0.3%, and the response time was $3.0 \times 10^{-5}$ (s). In the working example 2 as well, it was possible to shorten the response time as compared with the above-described comparative examples 1 and 2.

Working Example 3

In the photoelectric conversion element 10 illustrated in FIG. 2, the measurement was made for the response time in a case where the subphthalocyanine derivative represented in the above-described Chemical Formula 4 was used as the photoelectric conversion layer 13. With the exception that the organic semiconductor used for the photoelectric conversion layer 13 is different, the element was fabricated, and the measurement was made for the quantum efficiency and the response time in a manner similar to the above-described working example 1.

As a result of the above-described measurement, the quantum efficiency of the subphthalocyanine derivative (Chemical Formula 4) was 0.7%, and the response time was $3.5 \times 10^{-5}$ (s). In the working example 3 as well, it was possible to shorten the response time as compared with the above-described comparative examples 1 and 2.

FIG. 6 illustrates response time in each of the working examples 1 to 3 and the comparative examples 1 and 2. In the working examples 1 to 3 in which the organic semiconductor with quantum efficiency of 1% or less was used for the photoelectric conversion layer 13, it was seen that the response time was shorter in comparison with the comparative examples 1 and 2 in which the organic semiconductor with the quantum efficiency of more than 1% was used. Further, this result shows that having specifically a structure represented by each of the general formulas of the above-described Chemical Formulas 2 to 4 in the subphthalocyanine derivative represented by the general formula of the above-described Chemical Formula 1, that is, having a structure in which each of R1, R4, R5, R8, R9, and R12 is a hydrogen atom and each of R2, R3, R6, R7, R10, and R11 is a fluorine atom ensures that the quantum efficiency is 1% or less, which is advantageous in improvement of the optical responsivity.

Working Example 4

In the photoelectric conversion element 10 illustrated in FIG. 2, the measurement was made for the response time in a case where the bulk heterojunction was formed as the photoelectric conversion layer 13 by mixing the electron-transport material and the hole-transport material, and the subphthalocyanine derivative represented in the above-described Chemical Formula 2 was used as the electron-transport material. The photoelectric conversion element 10 used for measurement was a photoelectric conversion element in which the first electrode including ITO, the photoelectric conversion layer 13, and the second electrode 14 including Al were formed in this order on the support substrate 11 including quartz. As the photoelectric conversion layer 13, a film of the subphthalocyanine derivative (Chemical Formula 2) and a film of 2, 9-di-tert-butylquinacridon as the hole-transport material were formed with a thickness of 100 nm at a deposition rate of 1:1 by a vapor deposition method. It is to be noted that the response time (s) was measured in a manner similar to the above-described working example 1. Further, the quantum efficiency of the subphthalocyanine derivative (Chemical Formula 2) was 0.1% as described in the working example 1.

In addition, as a comparative example (a comparative example 3) relative to the working example 4, an element that used the subphthalocyanine derivative represented by the general formula of the above-described Chemical Formula 6 as the electron-transport material was fabricated, and the response time was measured under conditions similar to those of the working example 4 other than the above-described condition.

As a result of the above-described measurement, in the working example 4 that used the photoelectric conversion layer 13 in which the bulk heterojunction was formed with use of the subphthalocyanine derivative (Chemical Formula 2) having the quantum efficiency of 0.1%, the response time was $4.0 \times 10^{-5}$ (s). Further, in the comparative example 3, the response time was $3.5 \times 10^{-4}$ (s). In the working example 4, it was possible to shorten the response time as compared with the comparative example 3.

Working Example 5

In the photoelectric conversion element 10 illustrated in FIG. 2, the measurement was made for the response time in a case where the bulk heterojunction was formed as the photoelectric conversion layer 13 by laminating the electron-transport material and the hole-transport material, and the subphthalocyanine derivative represented in the above-described Chemical Formula 3 was used as the electron-transport material. The photoelectric conversion element 10 used for measurement was a photoelectric conversion element in which the first electrode including ITO, the photoelectric conversion layer 13, and the second electrode 14 including Al were formed in this order on the support substrate 11 including quartz. As the photoelectric conversion layer 13, a film of the subphthalocyanine derivative (Chemical Formula 3) and a film of N-methylquinacridone as the hole-transport material were formed with a thickness of 100 nm at a deposition rate of 1:1 by a vapor deposition method. It is to be noted that the response time (s) was measured in a manner similar to the above-described working example 1. Further, the quantum efficiency of the subphthalocyanine derivative (Chemical Formula 3) was 0.3% as described in the working example 2.

In addition, as a comparative example (a comparative example 4) relative to the working example 5, an element that used the subphthalocyanine derivative represented by the general formula of the above-described Chemical Formula 6 as the electron-transport material was fabricated, and the response time was measured under conditions similar to those of the working example 5 other than the above-described condition.

As a result of the above-described measurement, in the working example 5 that used the photoelectric conversion layer 13 in which the bulk heterojunction was formed with use of the subphthalocyanine derivative (Chemical Formula 3) having the quantum efficiency of 0.3%, the response time was $2.0 \times 10^{-5}$ (s). Further, in the comparative example 4, the response time was $3.0 \times 10^{-4}$ (s). In the working example 5, it was possible to shorten the response time as compared with the comparative example 3.

Working Example 6

In the photoelectric conversion element 10 illustrated in FIG. 2, the measurement was made for the response time in a case where the bulk heterojunction was formed as the photoelectric conversion layer 13 by laminating the electron-transport material and the hole-transport material, and the subphthalocyanine derivative represented in the above-described Chemical Formula 4 was used as the electron-transport material. The photoelectric conversion element 10 used for measurement was a photoelectric conversion element in which the first electrode including ITO, the photoelectric conversion layer 13, and the second electrode 14 including Al were formed in this order on the support substrate 11 including quartz. The first electrode 12 was formed with a thickness of 100 nm by a sputtering method. As the photoelectric conversion layer 13, a film of the subphthalocyanine derivative (Chemical Formula 4) and a film of 2, 9-di-tert-butylquinacridon as the hole-transport material were formed with a thickness of 100 nm at a deposition rate of 1:1 by a vapor deposition method. It is to be noted that the response time (s) was measured in a manner similar to the above-described working example 1. Further, the quantum efficiency of the subphthalocyanine derivative (Chemical Formula 4) was 0.7% as described in the working example 3.

As a result of the above-described measurement, in the working example 5 that used the photoelectric conversion layer 13 in which the bulk heterojunction was formed with use of the subphthalocyanine derivative (Chemical Formula 4) having the quantum efficiency of 0.7%, the response time was $8.3 \times 10^{-5}$ (s). In the working example 6 as well, it was possible to shorten the response time as compared with the comparative example 3.

Application Example

The solid-state imaging device 1 of the above-described embodiment is applicable to various kinds of electronic apparatuses having imaging functions. Examples of the electronic apparatuses include camera systems such as digital still cameras and video cameras, and mobile phones having imaging functions. FIG. 7 illustrates, for purpose of an example, a schematic configuration of an electronic apparatus 2 (e.g., a camera). The electronic apparatus 2 is, for example, a video camera that allows for shooting of a still image or a moving image. The electronic apparatus 2 includes the solid-state imaging device 1, an optical system (e.g., an optical lens) 310, a shutter unit 311, a driver 313, and a signal processor 312. The driver 313 drives the solid-state imaging device 1 and the shutter unit 311.

The optical system 310 guides image light (i.e., incident light) from an object toward the imaging region 1a of the solid-state imaging device 1. The optical system 310 may include a plurality of optical lenses. The shutter unit 311 controls a period in which the solid-state imaging device 1 is irradiated with the light and a period in which the light is blocked. The driver 313 controls transfer operation of the solid-state imaging device 1 and shutter operation of the shutter unit 311. The signal processor 312 performs various signal processes on signals outputted from the solid-state imaging device 1. A picture signal Dout having been subjected to the signal processes is stored in a storage medium such as a memory, or is outputted to a unit such as a monitor.

Although the description has been given by referring to the embodiment, and the examples, the contents of the present disclosure are not limited to the embodiment and the examples, and may be modified in a variety of ways. For example, a layered configuration of the photoelectric conversion element that has been described in the above-described embodiment is merely illustrative, and the photoelectric conversion element may further include other layers. For example, a variety of intermediate layers such as an electron blocking layer, a buffer layer, and an active layer may be provided between the photoelectric conversion layer 13 and each of the electrodes. Further, the material and thickness of each layer are merely illustrative, and are not limited to those described above.

Further, the effects described in the above-described embodiment and examples are illustrative, and effects to be achieved by the present disclosure may be effects other than those described herein, or may further include other effects.

It is to be noted that the present disclosure may be configured as follows.

(1)

A photoelectric conversion element including:

a first electrode;

a photoelectric conversion layer provided on the first electrode, and including an organic semiconductor with quantum efficiency of 1% or less; and a second electrode provided on the photoelectric conversion layer.

(2)

The photoelectric conversion element according to (1), in which the photoelectric conversion layer includes a bulk heterojunction of a hole-transport material and an electron-transport material, and quantum efficiency of the electron-transport material in the photoelectric conversion layer is 1% or less.

(3)

The photoelectric conversion element according to (2), in which the electron-transport material includes a subphthalocyanine derivative.

(4)

The photoelectric conversion element according to (3), in which the subphthalocyanine derivative is represented by the following general formula of Chemical Formula 1, where each of R1 to R12 contains one selected from a group including a hydrogen atom, a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the above-described R1 to R12, and Z is nitrogen, CH, or CH of which H is substituted by one selected from a group including substituent groups similar to those of the above-described R1 to R12.

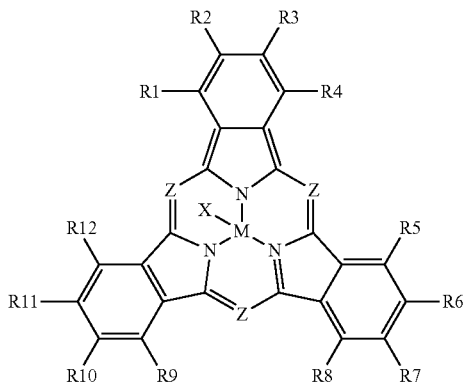

[Chemical Formula 1]

(5)

The photoelectric conversion element according to (4), in which in the general formula, each of R1, R4, R5, R8, R9, and R12 is a hydrogen atom, and each of R2, R3, R6, R7, R10, and R11 is a fluorine atom.

(6)

The photoelectric conversion element according to any one of (2) to (5), in which the quantum efficiency is at least 0.1% but no more than 0.7%.

(7)

The photoelectric conversion element according to any one of (1) to (6), in which one or both of the first electrode and the second electrode are a transparent oxide semiconductor.

(8)

The photoelectric conversion element according to (7), in which the transparent oxide semiconductor contains one or more of indium tin oxide (ITO), indium gallium zinc oxide (IGZO), zinc oxide (ZnO), indium zinc oxide (IZO), iridium oxide ($IrO_2$), titanium oxide ($TiO_2$), and tin oxide ($SnO_2$).

(9)

A method of manufacturing a photoelectric conversion element, the method including:

forming, on a first electrode, a photoelectric conversion layer that includes an organic semiconductor with quantum efficiency of 1% or less; and forming a second electrode on the photoelectric conversion layer.

(10)

The method of manufacturing the photoelectric conversion element according to (9), in which the photoelectric conversion layer includes a bulk heterojunction of a hole-transport material and an electron-transport material, and quantum efficiency of the electron-transport material in the photoelectric conversion layer is 1% or less.

(11)

The method of manufacturing the photoelectric conversion element according to (10), in which the electron-transport material includes a subphthalocyanine derivative.

(12)

The method of manufacturing the photoelectric conversion element according to (11), in which the subphthalocyanine derivative is represented by the following general formula of Chemical Formula 1, where each of R1 to R12 contains one selected from a group including a hydrogen atom, a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the above-described R1 to R12, and Z is nitrogen, CH, or CH of which H is substituted by one selected from a group including substituent groups similar to those of the above-described R1 to R12.

[Chemical Formula 1]

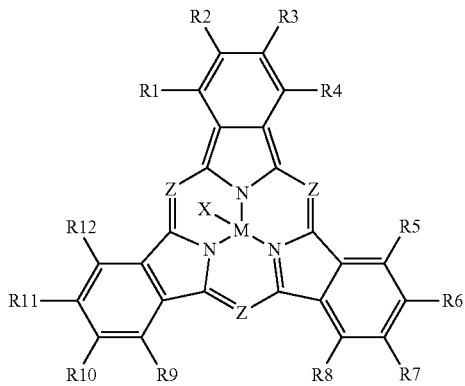

(13)
The method of manufacturing the photoelectric conversion element according to (12), in which in the general formula, each of R1, R4, R5, R8, R9, and R12 is a hydrogen atom, and each of R2, R3, R6, R7, R10, and R11 is a fluorine atom.

(14)
The method of manufacturing the photoelectric conversion element according to any one of (10) to (13), in which the quantum efficiency is at least 0.1% but no more than 0.7%.

(15)
The method of manufacturing the photoelectric conversion element according to any one of (9) to (14), in which one or both of the first electrode and the second electrode are a transparent oxide semiconductor.

(16)
The method of manufacturing the photoelectric conversion element according to any one of (9) to (15), in which the transparent oxide semiconductor contains one or more of indium tin oxide (ITO), indium gallium zinc oxide (IGZO), zinc oxide (ZnO), indium zinc oxide (IZO), iridium oxide (IrO$_2$), titanium oxide (TiO$_2$), and tin oxide (SnO$_2$).

(17)
A solid-state imaging device having a photoelectric conversion element, the photoelectric conversion element including:
a first electrode;
a photoelectric conversion layer provided on the first electrode, and including an organic semiconductor with quantum efficiency of 1% or less; and
a second electrode provided on the photoelectric conversion layer.

This application is based upon and claims the benefit of priority of Japanese Patent Application No. 2015-118105 filed in the Japan Patent Office on Jun. 11, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A photoelectric conversion element, comprising:
a first electrode;
a photoelectric conversion layer on the first electrode; and
a second electrode on the photoelectric conversion layer, wherein
the photoelectric conversion layer includes a bulk heterojunction of a hole-transport material and an electron-transport material,
a quantum efficiency of the electron-transport material is 1% or less,
the electron-transport material includes a subphthalocyanine derivative,
the subphthalocyanine derivative is represented by the following general formula of Chemical Formula 1,
where each of R1 to R12 contains one selected from a group including a hydrogen atom, a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the R1 to R12, and Z is nitrogen, CH, or CH of which H is substituted by one selected from a group including substituent groups similar to those of the R1 to R12,

[Chemical Formula 1]

[Structure with R1-R12 substituents, central M atom with X, and Z/N atoms]

in the general formula, each of R1, R4, R5, R8, R9, and R12 is a hydrogen atom, and each of R2, R3, R6, R7, R10, and R11 is a fluorine atom.

2. The photoelectric conversion element according to claim 1, wherein the quantum efficiency is greater than or equal to 0.1% and less than or equal to 0.7%.

3. The photoelectric conversion element according to claim 1, wherein at least one of the first electrode or the second electrode is a transparent oxide semiconductor.

4. The photoelectric conversion element according to claim 3, wherein the transparent oxide semiconductor contains at least of indium tin oxide (ITO), indium gallium zinc oxide (IGZO), zinc oxide (ZnO), indium zinc oxide (IZO), iridium oxide ($IrO_2$), titanium oxide ($TiO_2$), or tin oxide ($SnO_2$).

5. A method of manufacturing a photoelectric conversion element, the method comprising:
forming a photoelectric conversion layer on a first electrode; and
forming a second electrode on the photoelectric conversion layer, wherein
the photoelectric conversion layer includes a bulk heterojunction of a hole-transport material and an electron-transport material,
a quantum efficiency of the electron-transport material is 1% or less,
the electron-transport material includes a subphthalocyanine derivative,
the subphthalocyanine derivative is represented by the following general formula of Chemical Formula 1, where each of R1 to R12 contains one selected from a group including a hydrogen atom, a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the R1 to R12, and Z is nitrogen, CH, or CH of which H is substituted by one selected from a group including substituent groups similar to those of the R1 to R12,

[Chemical Formula 1]

[Structure with R1-R12 substituents, central M atom with X, and Z/N atoms]

in the general formula, each of R1, R4, R5, R8, R9, and R12 is a hydrogen atom, and each of R2, R3, R6, R7, R10, and R11 is a fluorine atom.

6. The method of manufacturing the photoelectric conversion element according to claim 5, wherein the quantum efficiency is greater than or equal to 0.1% and less than or equal to 0.7%.

7. The method of manufacturing the photoelectric conversion element according to claim 5, wherein at least one of the first electrode or the second electrode is a transparent oxide semiconductor.

8. The method of manufacturing the photoelectric conversion element according to claim 7, wherein the transparent oxide semiconductor contains at least one of indium tin oxide (ITO), indium gallium zinc oxide (IGZO), zinc oxide (ZnO), indium zinc oxide (IZO), iridium oxide ($IrO_2$), titanium oxide ($TiO_2$), or tin oxide ($SnO_2$).

9. A solid-state imaging device comprising:
a photo electric conversion element that includes:
a first electrode;
a photoelectric conversion layer on the first electrode; and
a second electrode on the photoelectric conversion layer, wherein
the photoelectric conversion layer includes a bulk heterojunction of a hole-transport material and an electron-transport material,
a quantum efficiency of the electron-transport material is 1% or less,
the electron-transport material includes a subphthalocyanine derivative,
the subphthalocyanine derivative is represented by the following general formula of Chemical Formula 1, each of R1 to R12 contains one selected from a group including a hydrogen atom, a halogen atom (F, Cl, Br, and I), a straight-chain, branched, or cyclic alkyl group, a phenyl group, a straight-chain or condensed aromatic ring group, a partial fluoroalkyl group, a perfluoroalkyl group, a group of halide, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxyl group, an alkoxy group, an acyl amino group, an acyloxy group, a carboxy group, a carboxy imide group, a carboalkoxy group, an acyl group, a sulfonyl group, a cyano group, a nitro group, a vinyl group, an allyl group, a (meta) acryloyl group, a glycidyl group, an aziridine ring, an isocyanate group, a conjugated diene-based group, an acid anhydride-based group, an acid chloride-based group, a carbonyl group, a hydroxy group, an amide group, a chloromethyl group, an ester group, a formyl group, a nitrile group, a carbodiimide group, and an oxazoline group, M contains one of boron (B), divalent metal, and trivalent metal, X contains one of an anionic group and a group including substituent groups similar to those of the R1 to R12, and Z is nitrogen, CH, or CH of which H is substituted by one selected from a group including substituent groups similar to those of the R1 to R12,

[Chemical Formula 1]

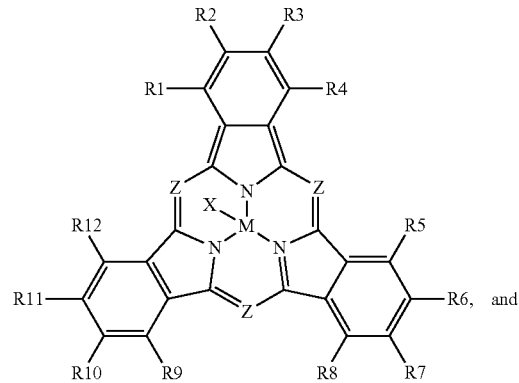

in the general formula, each of R1, R4, R5, R8, R9, and R12 is a hydrogen atom, and each of R2, R3, R6, R7, R10, and R11 is a fluorine atom.

* * * * *